United States Patent
Kang et al.

(10) Patent No.: US 7,949,819 B2
(45) Date of Patent: May 24, 2011

(54) FLASH MEMORY DEVICE AND METHOD OF CHANGING BLOCK SIZE IN THE SAME USING ADDRESS SHIFTING

(75) Inventors: Sang-chul Kang, Hwaseong-si (KR); Jin-yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 702 days.

(21) Appl. No.: 11/978,582

(22) Filed: Oct. 30, 2007

(65) Prior Publication Data

US 2008/0144381 A1    Jun. 19, 2008

(30) Foreign Application Priority Data

Dec. 18, 2006   (KR) ................... 10-2006-0129664

(51) Int. Cl.
  *G06F 12/00*   (2006.01)
  *G06F 13/00*   (2006.01)
  *G06F 13/28*   (2006.01)
  *G06F 9/26*   (2006.01)
  *G06F 9/34*   (2006.01)
(52) U.S. Cl. ................. 711/103; 711/200; 711/E12.002
(58) Field of Classification Search .................. None
  See application file for complete search history.

(56) References Cited

U.S. PATENT DOCUMENTS

| | | | | |
|---|---|---|---|---|
| 4,315,312 A | * | 2/1982 | Schmidt | 711/172 |
| 5,295,254 A | * | 3/1994 | Ogawa | 365/230.03 |
| 5,398,210 A | * | 3/1995 | Higuchi | 365/230.03 |
| 5,860,147 A | | 1/1999 | Gochman et al. | |
| 6,591,327 B1 | * | 7/2003 | Briner et al. | 711/103 |
| 6,611,796 B1 | * | 8/2003 | Natarajan et al. | 703/28 |
| 7,193,897 B2 | * | 3/2007 | Lee | 365/185.17 |
| 7,366,866 B2 | * | 4/2008 | Cochran et al. | 711/171 |
| 2003/0154351 A1 | * | 8/2003 | Nilsson et al. | 711/141 |
| 2004/0024971 A1 | * | 2/2004 | Bogin et al. | 711/135 |
| 2005/0144361 A1 | * | 6/2005 | Gonzalez et al. | 711/103 |
| 2006/0140001 A1 | * | 6/2006 | Lee | 365/185.17 |
| 2007/0124531 A1 | * | 5/2007 | Nishihara | 711/3 |
| 2007/0263457 A1 | * | 11/2007 | Park | 365/185.33 |
| 2008/0034153 A1 | * | 2/2008 | Lee et al. | 711/103 |
| 2008/0034154 A1 | * | 2/2008 | Lee et al. | 711/103 |
| 2008/0037324 A1 | * | 2/2008 | Wen-Tai Shuy et al. | 365/185.05 |

FOREIGN PATENT DOCUMENTS

JP   06-332797        12/1994
KR   100204810 B1      3/1999

* cited by examiner

*Primary Examiner* — Matt Kim
*Assistant Examiner* — Matthew R Chrzanowski
(74) *Attorney, Agent, or Firm* — Harness, Dickey & Pierce, P.L.C.

(57) ABSTRACT

According to an example embodiment, a method of changing a block size in a flash memory device having a multi-plane scheme may include decoding an external input address and changing the block size of the flash memory device from a first block size to a second block size. The external input address may be decoded into a block address and a page address. The block size of the flash memory device may be changed from the first block size to the second block size by shifting at least one bit of the block address to the page address or shifting at least one bit of the page address to the block address.

17 Claims, 6 Drawing Sheets

FLASH MEMORY DEVICE AND METHOD OF CHANGING BLOCK SIZE IN THE SAME USING ADDRESS SHIFTING

PRIORITY STATEMENT

This application claims priority under 35 U.S.C. §119 to Korean Patent Application No. 2006-0129664, filed on Dec. 18, 2006, in the Korean Intellectual Property Office, the entire contents of which are incorporated herein by reference.

BACKGROUND

Flash memory is a nonvolatile memory in which data may be electrically erased and programmed. Flash memory may be used as both random access memory (RAM), in which data may be freely written and deleted, and read only memory (ROM), which may preserve data even when power is not supplied thereto. Thus, flash memory may be widely used as a storage medium for portable electronic devices such as digital cameras, personal digital assistants (PDAs), and MP3 players.

FIG. 1A illustrates a flash memory device 10 having a fixed block size of 128 KB and FIG. 1B illustrates the address structure of the flash memory device 10 illustrated in FIG. 1A. FIG. 2A illustrates a flash memory device 20 having a fixed block size of 256 KB and FIG. 2B illustrates the address structure of the flash memory device 20 illustrated in FIG. 2A.

Referring to FIGS. 1A, 1B, 2A and 2B, the flash memory devices 10 and 20 may have a multi-plane structure including a plurality of planes Plane 1 and Plane 2. The memory cell array of the flash memory device 10 illustrated in FIG. 1A may include 2048 blocks, each having a size of 128 KB. Each of the blocks of the flash memory device 10 illustrated in FIG. 1A may be located in one of the two planes Plane 1 and Plane 2 and include 64 pages. The blocks of the flash memory device 10 illustrated in FIG. 1A may be addressed in a manner such that two neighboring blocks are located in different planes. Thus, blocks located in the plane Plane 1 may be addressed as Block0, Block2, Block4, . . . , Block2046.

The flash memory device 20 illustrated in FIG. 2A may include 1024 blocks, each having a size of 256 KB. One block of the flash memory device 20 illustrated in FIG. 2A may correspond to two combined blocks respectively located in different planes as illustrated in FIG. 2A. Thus, the blocks of the flash memory device 20 may have a size twice that of the blocks of the flash memory device 10. Each of the blocks of the flash memory 20 may include 128 pages.

FIGS. 1B and 2B respectively illustrate address structures corresponding to memory cell array structures of the flash memory devices 10 and 20 illustrated in FIGS. 1A and 2A. When the flash memory devices 10 and 20 receive a 17-bit external input address, an address controller (not shown) may decode the external input address into a block address and a page address in order to map the external input address to the memory cell array. Accordingly, the address structure corresponding to the flash memory device 10 illustrated in FIG. 1A may have an 11-bit block address and a 6-bit page address, as illustrated in FIG. 1B. The address structure corresponding to the flash memory device 20 illustrated in FIG. 2A may have a 10-bit block address and a 7-bit page address.

As described above, conventional flash memory devices may have fixed block sizes and physically fixed address structures, where the block size of the flash memory devices may not be changed.

SUMMARY

According to an example embodiment, a method of changing a block size in a flash memory device having a multi-plane scheme may include decoding an external input address and/or changing the block size of the flash memory device from a first block size to a second block size. The external input address may be decoded into a block address and a page address. The block size of the flash memory device may be changed from the first block size to the second block size by shifting at least one bit of the block address to the page address or shifting at least one bit of the page address to the block address.

According to another example embodiment, a method of operating a flash memory having a multi-plane scheme may include combining two 1-plane blocks having a first block size and respectively located in different planes into a single 2-plane block having a second block size by shifting at least one bit of a block address to a page address. The method may also include obtaining the block address and the page address by decoding an external input address. The method may also include erasing the 2-plane block in response to a single erase command set. The method may also include programming the 2-plane block.

According to another example embodiment, a flash memory device may include a memory cell array, an address controller, and/or a decoder. The memory cell array may be divided into a plurality of planes and include blocks. Each block may have a plurality of pages. The address controller may be configured to decode an external input address into a block address and a page address. The address controller may also be configured to change the size of the blocks from a first block size to a second block size by shifting at least one bit of the block address to the page address or shifting at least one bit of the page address to the block address in response to a block size change signal. The decoder may be configured to activate a block and a page of the memory cell array based on the block address and the page address.

BRIEF DESCRIPTION OF THE DRAWINGS

The above and other features and advantages of the example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1A:
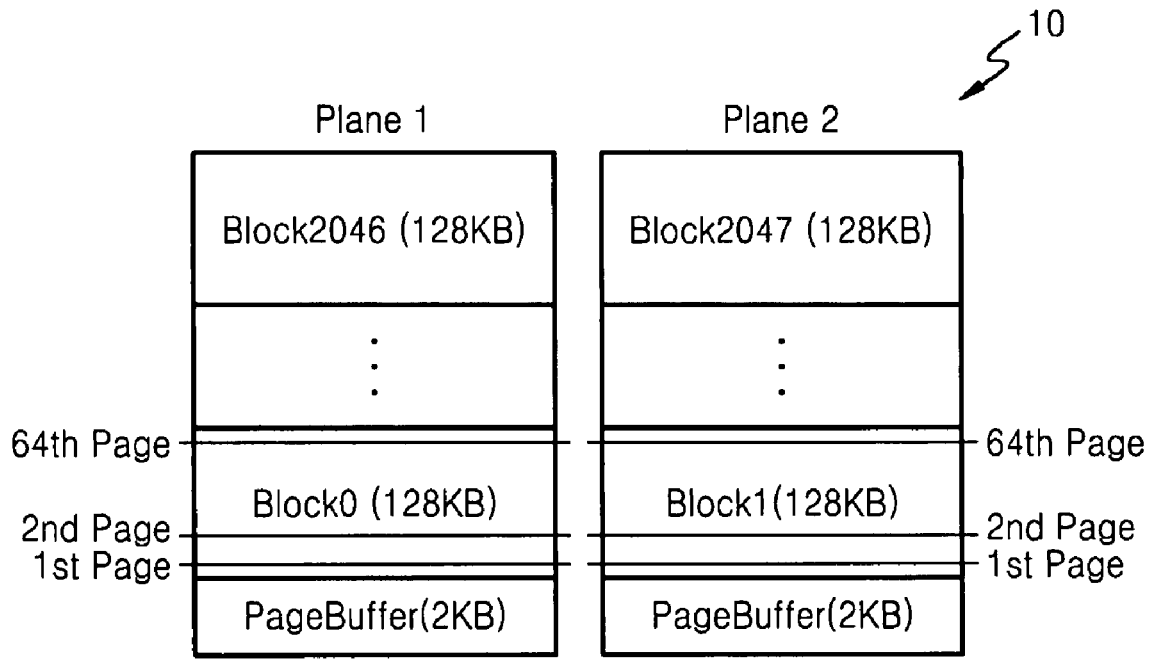
FIGS. 1A and 1B respectively illustrate a conventional flash memory device having a fixed block size of 128 KB and an address structure of the conventional flash memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
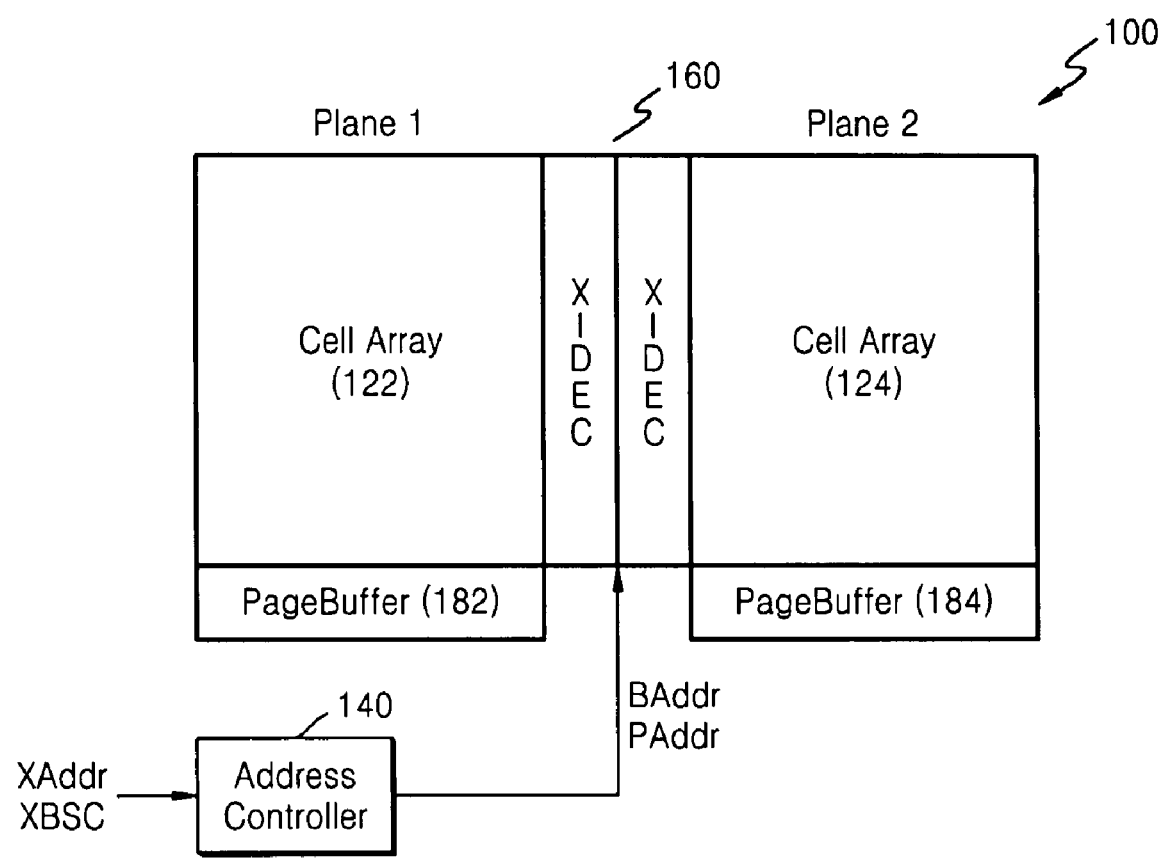
FIG. 3 is a block diagram of a flash memory device according to an example embodiment.

FIG. 3 is a block diagram of a flash memory device 100 according to an example embodiment. Referring to FIG. 3, the flash memory device 100 may include a memory cell array, an address controller 140, and/or a decoder 160. The flash memory device 100 may be a NAND type flash memory device, for example. The memory cell array may be divided into two planes 122 and 124.

Figure 2A:
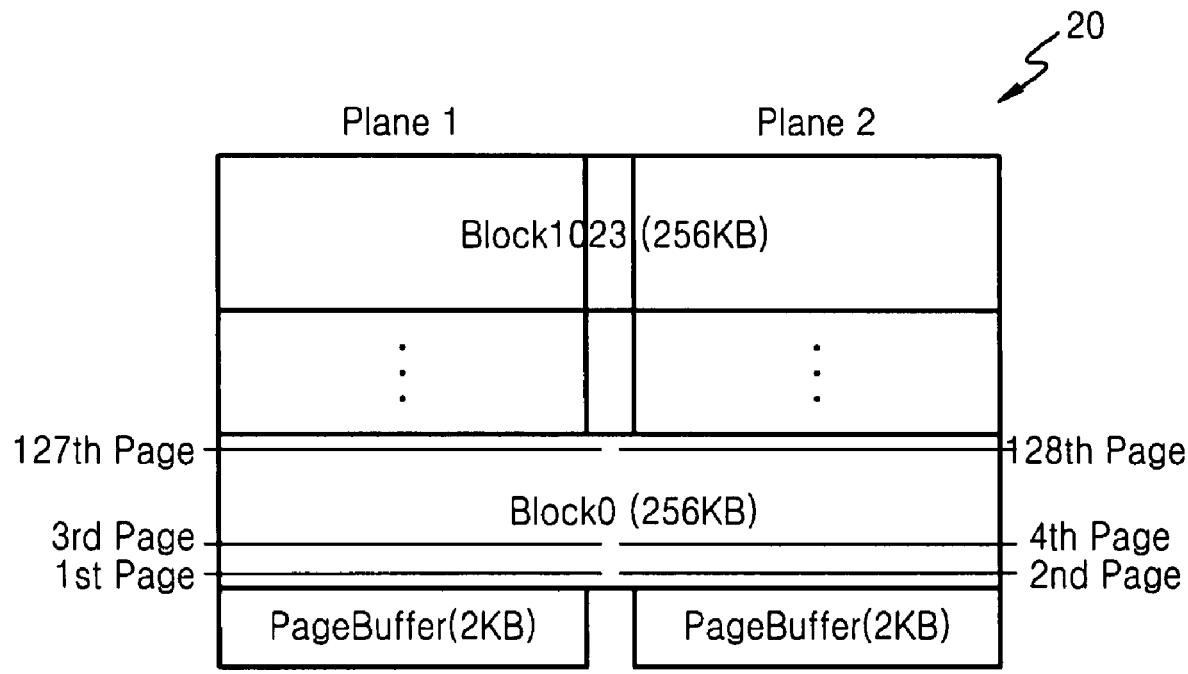
FIGS. 2A and 2B respectively illustrate a conventional flash memory device having a fixed block size of 256 KB and an address structure of the conventional flash memory device.

The flash memory device 100 may have a structure similar to either of those illustrated in FIGS. 1A and 2A. For example, the flash memory device 100 may include 2048 blocks each having a size of 128 KB as illustrated in FIG. 1A, or 1024 blocks each having a size of 256 KB as illustrated in FIG. 2A. As described above, two neighboring blocks illustrated in FIG. 1A may be respectively located in two planes, and each of the blocks illustrated in FIG. 2A may correspond to two combined blocks respectively located in different planes.

Hereinafter, the block size of the blocks illustrated in FIG. 1A may be referred to as a first block size, and the block size of the blocks illustrated in FIG. 2A may be referred to as a second block size. In addition, blocks located in different planes and having the first block size may be referred to as a 1-plane block, and a block corresponding to two combined 1-plane blocks with the second block size may be referred to as a 2-plane block.

The address controller 140 may change the block size of the flash memory device 100 in response to a block size change signal XBSC. For example, the address controller 140 may change the block size of a flash memory device 100 from the first block size to the second block size, or change the block size of the flash memory device 100 from the second block size to the first block size. For example, when the memory cell array includes 1-plane blocks, the 1-plane blocks may be combined into a 2-plane block. When the memory cell array includes 2-plane blocks, each of the 2-plane blocks may be divided into two 1-plane blocks.

Thus, the flash memory device 100 according to an example embodiment may combine or divide blocks to change the block size using address shifting.

Figure 4A:
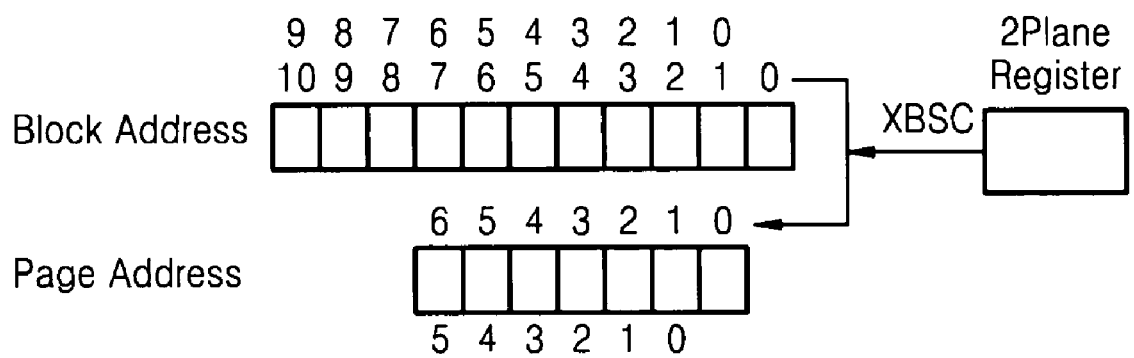
FIG. 4A illustrates an address structure for combining two blocks in the flash memory device of FIG. 3 according to an example embodiment.

FIG. 4A illustrates an example address structure which may be used to combine two blocks each having a size of 128 KB into a single block having a size of 256 KB, in the flash memory device 100, according to an example embodiment. Referring to FIGS. 3 and 4A, when the flash memory device 100 receives an external input address XAddr, the address controller 140 may decode the external input address XAddr into a block address BAddr and a page address PAddr. For example, when the memory cell array of the flash memory device 100 is an equivalent size to the memory cell arrays illustrated in FIGS. 1A and 2A, the external input address XAddr may include 17 bits.

Thus, when the flash memory device 100 includes 2048 blocks each having a size of 128 KB with 64 pages, as illustrated in FIG. 1A, the address controller 140 may decode the 17-bit external input address XAddr into an 11-bit block address BAddr and a 6-bit page address PAddr.

Figure 1B:
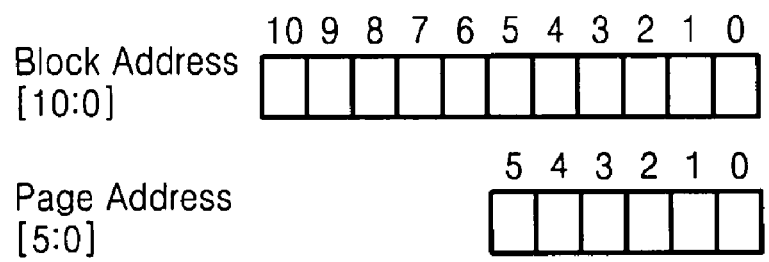
Figure 2B:
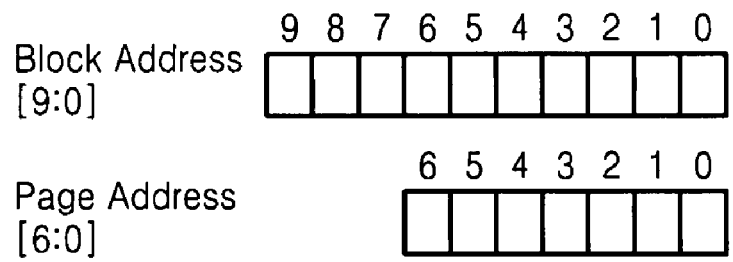

When the block size change signal XBSC is applied to the flash memory device 100, the address controller 140 may shift the least significant bit (LSB) of the block address BAddr to the LSB of the page address PAddr, as illustrated in FIG. 4A. Accordingly, the 11-bit block address BAddr may be adjusted to 10-bits, and the 6-bit page address PAddr may be adjusted to 7-bits. Accordingly, the address structure illustrated in FIG. 1B may be changed to the address structure illustrated in FIG. 2B. The upper 10 bits of the block address BAddr and the upper 5 bits of the page address PAddr may remain unchanged.

For example, the "Block 0" and "Block 1" illustrated in FIG. 1A may be combined into the "Block 0" illustrated in FIG. 2A, and the address of the "2nd page" of "Block 1" before combination may be compared to the address of the "2nd page" of "Block 1" after combination. The "2nd page" of "Block 1" may be mapped to the block address BAddr of "00000000001" and the page address PAddr of "000001", for example. When the address controller 140 receives the block size change signal XBSC, the LSB "1" of the "2nd page" of "Block 1" may be shifted to the LSB of the page address PAddr. Accordingly, the "2nd page" of "Block 1", after "Block 0" and "Block 1" are combined, may be mapped to the block address BAddr of "0000000000" and the page address PAddr of "0000011". This may correspond to the "4th page" of "Block 0" illustrated in FIG. 2A. Thus, the block size may be changed from 128 KB to 256 KB without varying the design of the flash memory 100. The block size change signal XBSC may be set as a given value in a register, for example.

Figure 4B:
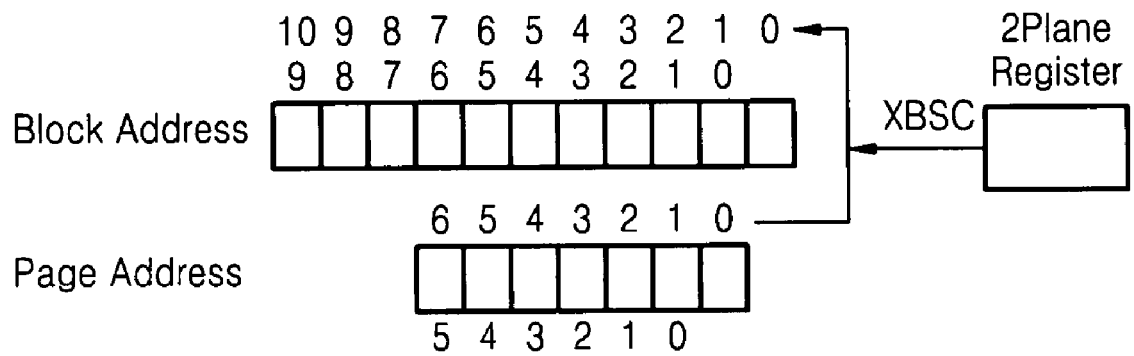
FIG. 4B illustrates an address structure used to divide a single block in the flash memory device of FIG. 3 according to an example embodiment.

FIG. 4B illustrates an address structure which may be used to divide a single block having a size of 256 KB into two blocks, each having a size of 128 KB. Referring to FIGS. 3 and 4B, the flash memory device 100 may include 1024 blocks, each having a size of 256 KB and including 128 pages, as illustrated in FIG. 2A. Thus, for example, the address controller 140 may decode a 17-bit external input address XAddr into a 10-bit block address BAddr and a 7-bit page address PAddr.

When the block size change signal XBSC is applied to the address controller 140, the address controller 140 may shift the LSB of the page address PAddr to the LSB of the block address BAddr. Thus, the 10-bit block address BAddr may be changed to 11-bits, and the 7-bit page address PAddr may be changed to 6-bits. Accordingly, the address structure illustrated in FIG. 2B may be changed to the address structure illustrated in FIG. 1B.

When address shifting is used, blocks may be mapped to the same addresses even when the block size is changed, irrespective of the address structure of the flash memory.

Figure 5A:
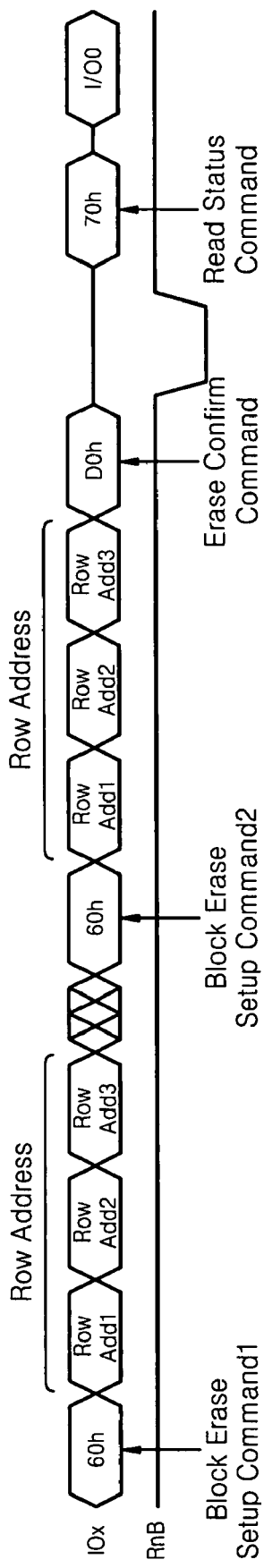
FIG. 5A illustrates a multi-plane erase method for use in a conventional flash memory device.

FIG. 5A illustrates a multi-plane erase method used in the conventional flash memory device 10. Referring to FIGS. 1A and 5A, for a multi-plane erase operation to simultaneously erase "Block 0" and "Block 1" respectively located in different planes, the flash memory device 10 may set an address and apply an erase command for each plane.

Specifically, the multi-plane erase operation in the structure as illustrated in FIG. 1A may apply a block erase setup command 1 to a plane Plane1 and set an address, and then apply a block erase setup command 2 to another plane Plane2 and set an address. An erase confirm command may be applied to simultaneously erase the contents of cells located in "Block 0" and "Block 1".

Figure 5B:
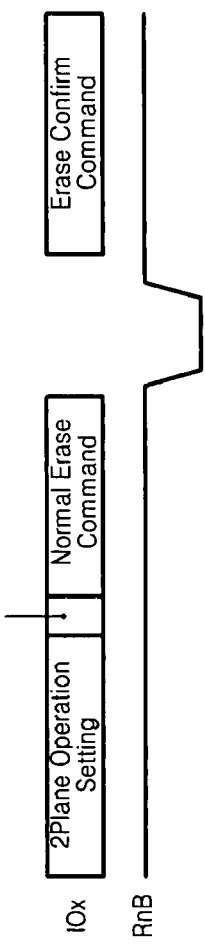
FIG. 5B illustrates a multi-plane erase method for use in a flash memory device according to an example embodiment.

FIG. 5B illustrates a multi-plane erase method used in a flash memory device according to an example embodiment. Referring to FIGS. 1A, 2A and 5B, "Block 0" and "Block 1" illustrated in FIG. 1A may be combined into the "Block 0" illustrated in FIG. 2A using the aforementioned addressing shifting, and thus the multi-plane erase operation may require only a single address setting and erase setup command (including an erase confirm command).

Figure 6A:
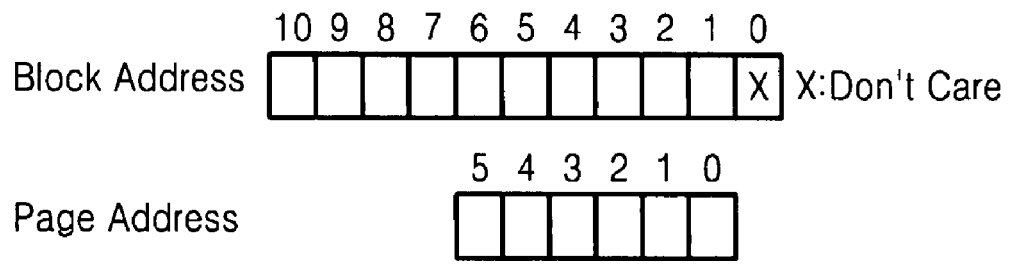
FIG. 6 illustrates an address structure for multi-plane programming in a flash memory device according to an example embodiment.
Figure 6B:
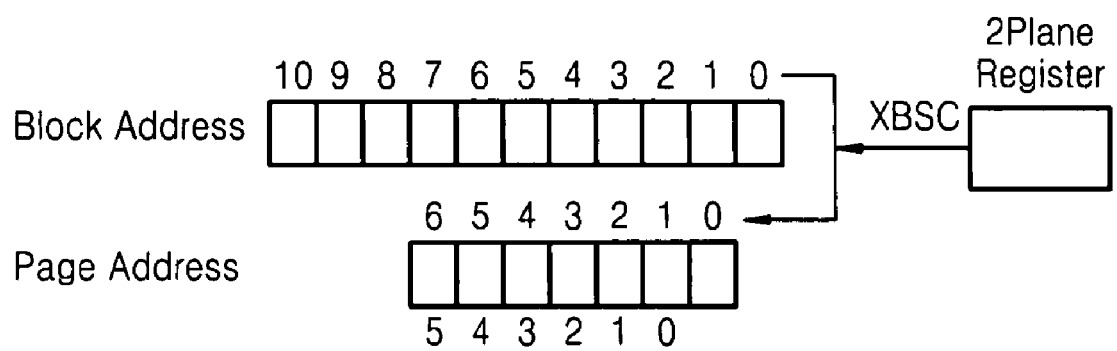

FIGS. 6A and 6B illustrate an address structure for a multi-plane programming operation for use in a flash memory device according to an example embodiment. The multi-plane programming operation for use in a flash memory device having a multi-plane structure may alternately program pages respectively located in different 1-plane blocks. For example, the "1st page" of "Block 0" illustrated in FIG. 1A may be programmed, and then "1st page" of "Block 1" may be programmed. In this manner, pages respectively located in different 1-plane blocks may be alternately programmed.

Accordingly, in the address structure illustrated in FIGS. 6A and 6B, the LSB "0" of the block address BAddr may become a "Don't care." However, the flash memory device 10 illustrated in FIG. 1A may not be able to execute a sequential reading operation on data programmed by multi-plane programming. For example, the flash memory device 10 illustrated in FIG. 1A may read data in a manner that pages are sequentially read in the same plane. Specifically, "1st page" of "Block 0" illustrated in FIG. 1A may be read, and then "2nd page" of "Block 0" may be read. Subsequently, "3rd page" of "Block 0" may be read. Accordingly, data programmed by multi-plane programming operation may not be sequentially read.

However, a flash memory device according an example embodiment may sequentially read data programmed by multi-plane programming operation by combining the 1-plane blocks illustrated in FIG. 1A into the 2-plane blocks illustrated in FIG. 2A without changing the design of the flash memory.

As described above, in a flash memory device and method of changing the block size of a flash memory device according example embodiments, the LSB of the block address may be shifted to the LSB of the page address or the LSB of the page address may be shifted to the LSB of the block address in order to combine blocks located in different planes or divide combined blocks to internally change the block size. Furthermore, a flash memory device according example embodiments may more easily execute a multi-plane erase operation and a sequential reading operation.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of changing a block size in a flash memory device having a multi-plane scheme, the method comprising:
   decoding an external input address into a block address and a page address; and
   changing the block size of the flash memory device from a first block size to a second block size by shifting at least one bit of the block address to the page address or shifting at least one bit of the page address to the block address,
   wherein changing the block size includes combining two 1-plane blocks of the first block size respectively located in different planes into a 2-plane block of the second block size, and
   wherein changing the block size shifts a least significant bit (LSB) of the block address to a LSB of the page address.

2. The method of claim 1, wherein the second block size is twice the first block size.

3. The method of claim 1, wherein the flash memory device includes two planes.

4. The method of claim 1, wherein the flash memory device is a NAND type flash memory device.

5. A method of changing a block size in a flash memory device having a multi-plane scheme, the method comprising:
   decoding an external input address into a block address and a page address; and
   changing the block size of the flash memory device from a first block size to a second block size by shifting at least one bit of the block address to the page address or shifting at least one bit of the page address to the block address,
   wherein changing the block size includes dividing a 2-plane block having the first block size into two 1-plane blocks having the second block size and respectively located in different planes, and
   wherein changing the block size shifts a least significant bit (LSB) of the page address to a LSB of the block address.

6. The method of claim 5, wherein the first block size is twice the second block size.

7. A method of operating a flash memory having a multi-plane scheme, the method comprising:
  combining two 1-plane blocks having a first block size and respectively located in different planes into a single 2-plane block having a second block size by shifting at least one bit of a block address to a page address; and
  obtaining the block address and the page address by decoding an external input address,
  wherein combining the two 1-plane blocks shifts a least significant bit (LSB) of the block address to a LSB of the page address.

8. The method of claim 7, further comprising:
  erasing the 2-plane block in response to a single erase command set.

9. The method of claim 7, further comprising:
  programming the two 1-plane blocks.

10. The method of claim 9, wherein programming the two 1-plane blocks alternately programs of the two 1-plane blocks.

11. The method of claim 10, further comprising:
  sequentially reading programmed pages in an order of the programming.

12. A flash memory device, comprising:
  a memory cell array divided into a plurality of planes and including blocks, each block having a plurality of pages; and
  an address controller configured to decode an external input address into a block address and a page address, and to change the size of the blocks from a first block size to a second block size by shifting at least one bit of the block address to the page address or shifting at least one bit of the page address to the block address in response to a block size change signal,
  wherein the address controller is configured to combine two 1-plane blocks having the first block size and respectively located in different planes into a 2-plane block having the second block size, and
  wherein the address controller shifts a least significant bit (LSB) of the block address to a LSB of the page address.

13. The flash memory device of claim 12, wherein the second block size is twice the first block size.

14. The flash memory device of claim 12, wherein the block size change signal is set as a register value.

15. The flash memory device of claim 12, wherein the memory cell array is divided into two planes.

16. The flash memory device of claim 12, wherein the flash memory is a NAND type flash memory device.

17. The flash memory device of claim 12, further comprising:
  a decoder configured to activate a block and a page of the memory cell array based on the block address and the page address.

* * * * *